United States Patent
Wada et al.

(10) Patent No.: US 8,785,301 B2
(45) Date of Patent: Jul. 22, 2014

(54) METHOD OF CLEANING SILICON CARBIDE SEMICONDUCTOR

(75) Inventors: Keiji Wada, Osaka (JP); Takeyoshi Masuda, Osaka (JP); Tomihito Miyazaki, Osaka (JP); Toru Hiyoshi, Osaka (JP); Satomi Itoh, Osaka (JP); Hiromu Shiomi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/390,869

(22) PCT Filed: Feb. 25, 2011

(86) PCT No.: PCT/JP2011/054275
§ 371 (c)(1),
(2), (4) Date: Feb. 16, 2012

(87) PCT Pub. No.: WO2011/158529
PCT Pub. Date: Dec. 22, 2011

(65) Prior Publication Data
US 2012/0149175 A1 Jun. 14, 2012

(30) Foreign Application Priority Data
Jun. 16, 2010 (JP) .................................. 2010-136871

(51) Int. Cl.
*H01L 21/322* (2006.01)
*H01L 21/31* (2006.01)
(52) U.S. Cl.
USPC ............ 438/476; 438/767; 438/787; 438/931
(58) Field of Classification Search
None
See application file for complete search history.

(56) References Cited

U.S. PATENT DOCUMENTS

| | | | | |
|---|---|---|---|---|
| 6,325,081 | B1 * | 12/2001 | Miki et al. | 134/102.1 |
| 6,375,752 | B1 | 4/2002 | Otsuki et al. | |
| 6,802,911 | B2 * | 10/2004 | Lee et al. | 134/28 |
| 6,837,944 | B2 * | 1/2005 | Kashkoush et al. | 134/28 |
| 6,946,036 | B2 * | 9/2005 | Tsuga et al. | 134/28 |
| 7,179,746 | B2 * | 2/2007 | Ohmi et al. | 438/697 |
| 7,264,680 | B2 * | 9/2007 | Gebhart et al. | 134/31 |
| 7,896,970 | B2 * | 3/2011 | Tomita et al. | 134/1.3 |

(Continued)

FOREIGN PATENT DOCUMENTS

| | | |
|---|---|---|
| JP | 4-354334 A | 12/1992 |
| JP | 6-314679 A | 11/1994 |

(Continued)

OTHER PUBLICATIONS

Notice of Grounds of Rejection in Japanese Patent Application No. 2010-136871, dated Feb. 4, 2014.

*Primary Examiner* — Scott B Geyer
(74) *Attorney, Agent, or Firm* — Venable LLP; Michael A. Sartori; Tamatane J. Aga

(57) ABSTRACT

A method of cleaning a SiC semiconductor includes the steps of forming an oxide film at the surface of a SiC semiconductor, and removing the oxide film. At the step of forming an oxide film, an oxide film is formed using ozone water having a concentration greater than or equal to 30 ppm. The forming step preferably includes the step of heating at least one of the surface of the SiC semiconductor and the ozone water. Thus, there can be obtained a method of cleaning a SiC semiconductor that can exhibit cleaning effect on the SiC semiconductor.

7 Claims, 4 Drawing Sheets

(56) References Cited

U.S. PATENT DOCUMENTS

| | | |
|---|---|---|
| 2001/0009155 A1* | 7/2001 | Matsuno et al. ............ 134/2 |
| 2002/0033130 A1* | 3/2002 | Hisada et al. ............ 117/84 |
| 2005/0048800 A1* | 3/2005 | Wagener ............ 438/785 |
| 2005/0215070 A1* | 9/2005 | Kobayashi ............ 438/770 |
| 2007/0145535 A1* | 6/2007 | Ohmi et al. ............ 257/618 |
| 2007/0218668 A1* | 9/2007 | Wagener ............ 438/591 |
| 2007/0295366 A1* | 12/2007 | Tomita et al. ............ 134/30 |
| 2009/0095712 A1* | 4/2009 | Yamauchi et al. ............ 216/53 |
| 2010/0093177 A1 | 4/2010 | Kozasa et al. |
| 2010/0159679 A1* | 6/2010 | Wada et al. ............ 438/507 |

FOREIGN PATENT DOCUMENTS

| | | |
|---|---|---|
| JP | 2000-331979 A | 11/2000 |
| JP | 2001-9394 A | 1/2001 |
| JP | 2002-33300 A | 1/2002 |
| JP | 2002-329694 A | 11/2002 |
| JP | 2008-108803 A | 5/2008 |
| JP | 2010-92938 A | 4/2010 |

\* cited by examiner

METHOD OF CLEANING SILICON CARBIDE SEMICONDUCTOR

TECHNICAL FIELD

The present invention relates to a method of cleaning silicon carbide (SiC) semiconductors, more particularly a method of cleaning a SiC semiconductor employed in a semiconductor device having an oxide film.

BACKGROUND ART

In a method of fabricating a semiconductor device, cleaning is conventionally carried out to remove any attachment adhering to the surface. The technique of such cleaning methods are disclosed in, for example, Japanese Patent Laying-Open No. 4-354334 (Patent Literature 1) and Japanese Patent Laying-Open No. 6-314679 (Patent Literature 2).

The method of cleaning a semiconductor disclosed in Patent Literature 1 has foreign object components adhering to the surface removed by spraying pure water including 1-5 ppm ozone to the semiconductor to cause ozone oxidation.

The method of cleaning a semiconductor substrate disclosed in Patent Literature 2 includes the steps of rinsing a silicon (Si) substrate with ultra pure water including ozone to form an Si oxide film, capturing particles and metal impurities into and/or on the surface of the Si oxide film, cleaning the Si film with dilute hydrofluoric acid aqueous solution to etch away the Si oxide film and remove the particles and metal impurities at the same time.

The technique of using ozone in the process of fabricating a semiconductor device is disclosed in Japanese Patent Laying-Open No. 2002-33300 (Patent Literature 3), for example. Patent Literature 3 teaches the approach of supplying ozone-containing pure water into an ozone water contactor, based on the condition that the ozone-containing pure water attains a temperature greater than or equal to approximately 22° C. and a dissolved ozone concentration greater than or equal to approximately 30 ppm, bringing the substrate including a remaining photoresist film in contact with the ozone-containing pure water to remove the photoresist film.

CITATION LIST

Patent Literature

PTL 1: Japanese Patent Laying-Open No. 4-354334
PTL 2: Japanese Patent Laying-Open No. 6-314679
PTL 3: Japanese Patent Laying-Open No. 2002-33300

SUMMARY OF INVENTION

Technical Problem

SiC is known to have a large band gap, as well as maximum breakdown field and heat conductivity greater than those of Si, while the carrier mobility is of a comparable level to Si. The electron saturation drift rate and breakdown voltage are also great. Therefore, the expectation for application of SiC to semiconductor devices requiring high efficiency, high breakdown voltage, and large capacitance is great. The inventors drew their attention to employ a SiC semiconductor for a semiconductor device. When SiC semiconductor is employed for a semiconductor device, the surface of the SiC semiconductor must be cleaned.

The inventors were the first to reveal that the surface of a SiC semiconductor is not readily oxidized, in the case where the cleaning method of Patent Literatures 1 and 2 is applied to SiC semiconductors, since SiC is a compound more thermally stable than Si. The cleaning method of Patent Literatures 1 and 2 allows the surface of Si to be oxidized, but not sufficiently the surface of SiC. Therefore, the surface of SiC could not be cleaned thoroughly.

The photoresist film removing method of Patent Literature 3 teaches the conditions to peel off a photoresist film. However, removing impurities and/or particles adhering to the surface of the semiconductor is not disclosed. The inventors were the first to reveal that, if the surface of a Si substrate is cleaned with the ozone-containing pure water disclosed in the photoresist film removing method of Patent Literature 3, the oxidizability of the ozone-containing pure water is so strong that the surface of the Si substrate will be roughened. In other words, the photoresist film removing method disclosed in Patent Literature 3 is directed to removing a photoresist film, and does not correspond to a cleaning method to remove impurities and/or particles remaining on the surface of Si and SiC semiconductors.

Therefore, an object of the present invention is to provide a method of cleaning a SiC semiconductor that can present a cleaning effect on the SiC semiconductor.

Solution to Problem

The present invention was completed as a result of diligent study by the inventors on the conditions to present a cleaning effect on SiC semiconductors. The method of cleaning a SiC semiconductor of the present invention includes the steps of forming an oxide film at a surface of a SiC semiconductor, and removing the oxide film. In the forming step, an oxide film is formed using ozone water having a concentration greater than or equal to 30 ppm.

The inventors drew their attention to the usage of ozone water having high oxidizability as an oxidant for oxidizing the surface of a SiC semiconductor that is a stable compound. As a result of diligent study, the inventors found out that the surface of a SiC semiconductor that is a stable compound can be oxidized by setting the concentration of the ozone water greater than or equal to 30 ppm. Since the surface of a SiC semiconductor can be oxidized effectively according to the method of cleaning a SiC semiconductor of the present invention, an oxide film can be formed with the impurities, particles and the like adhering to the surface captured. By removing this oxide film, the impurities, particles and the like present at the surface of the SiC semiconductor can be removed. Alternatively, the impurities and particles present at the surface can be removed therefrom directly by oxidization. Therefore, the method of cleaning a SiC semiconductor of the present invention can present a cleaning effect on a SiC semiconductor.

Preferably in the method of cleaning a SiC semiconductor set forth above, the forming step includes the step of heating at least one of the surface of the SiC semiconductor and the ozone water.

As a result of diligent study by the inventors to oxidize the surface of a SiC semiconductor that is a stable compound, the inventors found that oxidization at the surface of the SiC semiconductor can be facilitated by heating the wetted face between the ozone water and the surface of the SiC semiconductor. Therefore, by heating at least one of the surface of the SiC semiconductor and the ozone water, an oxide film can be readily formed. Thus, the impurities, particles and the like present at the surface of the SiC semiconductor can be removed more effectively.

Preferably in the method of cleaning a SiC semiconductor set forth above, the heating step includes the step of heating the ozone water greater than or equal to 25° C. and less than or equal to 90° C. Preferably in the method of cleaning a SiC semiconductor set forth above, the heating step includes the step of heating the surface of the SiC semiconductor greater than or equal to 25° C. and less than or equal to 90° C.

As a result of diligent study on conditions to facilitate oxidization at the surface of the SiC semiconductor, the inventors identified the above-described conditions. When the temperature is greater than or equal to 25° C., oxidation reaction can be facilitated. When the temperature is less than or equal to 90° C., ozone decomposition can be suppressed.

Preferably in the removing step in the method of cleaning a SiC semiconductor set forth above, the oxide film is removed using hydrogen fluoride (HF).

Accordingly, the oxide film remaining on the surface can be reduced since the oxide film can be readily removed.

Preferably in the method of cleaning a SiC semiconductor set forth above, the forming step and removing step are performed simultaneously.

Accordingly, an oxide film can be formed with the impurities, particles, and the like captured while removing the oxide film. Therefore, the time required for cleaning the SiC semiconductor can be shortened.

Preferably, in the method of cleaning a SiC semiconductor set forth above, the forming step includes the step of mixing carbon dioxide gas into the ozone water.

Accordingly, the pH of the ozone water can be reduced, allowing suppression of ozone decomposition, and formation of an oxide film with more impurities, particles, and the like such as of metal captured. The effect of directly oxidizing impurities and particles is also expected. Thus, the surface of a SiC semiconductor can be cleaned more effectively.

Advantageous Effects of Invention

According to the method of cleaning a SiC semiconductor of the present invention, the cleaning effect on the SiC semiconductor can be presented by forming an oxide film on the surface of the SiC semiconductor using ozone water having a concentration greater than or equal to 30 ppm.

DESCRIPTION OF EMBODIMENTS

Figure 1:
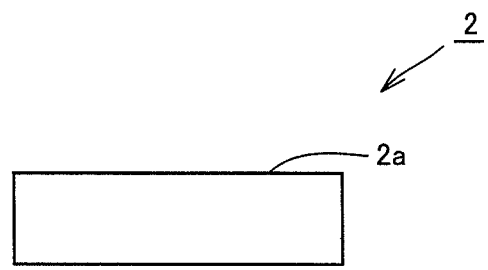
FIG. 1 is a schematic side view of a SiC semiconductor to be prepared according to a first embodiment of the present invention.

Embodiments of the present invention will be described hereinafter with reference to the drawings. In the drawings, the same or corresponding elements have the same reference characters allotted, and description thereof will not be repeated.

First Embodiment

Figure 2:
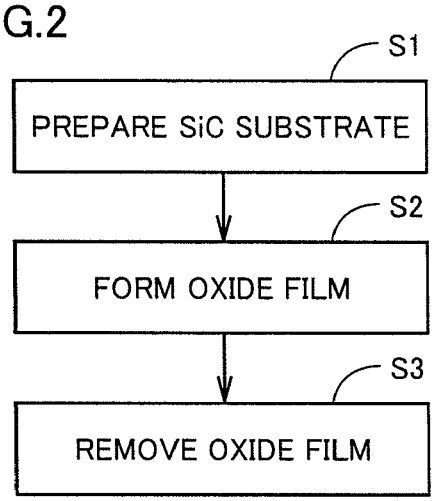
FIG. 2 is a flowchart of a method of cleaning a SiC semiconductor according to the first embodiment of the present invention.

FIG. 1 is a schematic side view of a SiC semiconductor prepared according to a first embodiment of the present invention. FIG. 2 is a flowchart of a method of cleaning a SiC semiconductor according to the first embodiment of the present invention. Referring to FIGS. 1 and 2, a method of cleaning a SiC semiconductor according to an embodiment of the present invention will be described. In the present embodiment, a method of cleaning a SiC substrate 2 shown in FIG. 1, identified as a SiC semiconductor, will be described.

Referring to FIGS. 1 and 2, a SiC substrate 2 having a surface 2a is prepared (step S1). SiC substrate 2 can be prepared by, but not particularly limited to, the method set forth below.

Specifically, there is prepared a SiC ingot grown by a vapor phase method such as HVPE (Hydride Vapor Phase Epitaxy) method, MBE (Molecular Beam Epitaxy) method, OMVPE (Organo Metallic Vapor Phase Epitaxy) method, sublimation, CVD (Chemical Vapor Deposition), flux growth, liquid phase growth such as high nitrogen pressure solution method, and the like. Then, a SiC substrate having a surface is cut out from the SiC ingot. The method of cutting out is not particularly limited, and a SiC substrate is cut out by slicing or the like from the SiC, ingot. Then, the surface of the cutout SiC substrate is polished. The face to be polished may be only the top surface, or also the backside, opposite to the top surface. The method of polishing is not particularly limited. For example, CMP (Chemical Mechanical Polishing) is performed to set the surface flat and reduce any damage such as a scratch. In CMP, colloidal silica is employed for the abrading agent; diamond and chromium oxide for the abrasive grain; and an adhesive or wax for the fixative. In addition to or alternative to CMP, other polishing methods such as electropolishing, chemical polishing, mechanical polishing may be performed. Alternatively, polishing is dispensable. Thus, SiC substrate 2 having surface 2a shown in FIG. 1 can be prepared. As such a SiC substrate 2, a substrate of n type conductivity, and having a resistance of 0.02 Ωcm can be used.

Then, as shown in FIG. 2, an oxide film is formed on surface 2a of SiC substrate 2 using ozone water having a concentration greater than or equal to 30 ppm (step S2). By oxidizing surface 2a of SiC substrate 2 at step S2, the particles, metal impurities and the like adhering to surface 2a of SiC substrate 2 are captured on the surface and inside the oxide film. The oxide film is of silicon oxide, for example.

At step S2, an oxide film is formed using ozone water having a concentration greater than or equal to 30 ppm. Since the reaction rate between surface 2a and ozone can be increased when the concentration is greater than or equal to 30 ppm, an oxide film can be substantially formed at surface 2a. Although a dissolved ozone concentration of ozone water as high as possible is preferable to facilitate oxidization reaction in view of SiC being a chemically stable compound, the upper limit of the concentration is 180 ppm, for example, from the standpoint of fabrication. In view of the foregoing, the concentration of ozone water is preferably greater than or equal to 50 ppm and less than or equal to 100 ppm.

The ozone water is not particularly limited as long as the water includes ozone greater than or equal to 30 ppm. Preferably, ultra pure water including ozone greater than or equal to 30 ppm is preferable. The concentration of the ozone water is the concentration when supplied to surface 2a of SiC substrate 2.

At step S2, preferably surface 2a of SiC substrate 2 and/or ozone water is heated. Accordingly, the wetted face between surface 2a and ozone water will be heated. When the temperature at the wetted face is high, oxidization reaction can be facilitated. In view of the foregoing, heating is preferably performed such that the wetted face attains a temperature greater than or equal to 25° C. and less than or equal to 90° C. In other words, at least one of surface 2a and the ozone water is preferably heated to attain at temperature greater than or equal to 25° C. and less than or equal to 90° C. When the temperature is greater than or equal to 25° C., the oxidization reaction can be facilitated. When the temperature is less than or equal to 90° C., ozone decomposition can be suppressed.

The method of heating SiC substrate 2 can be carried out by, but not particularly limited to, arranging a heater at the backside of SiC substrate 2 to apply heat from the backside. The method of heating ozone water is performed by, but not particularly limited to, heating a supply unit that supplies ozone water.

The oxidization-reduction potential of the ozone water is preferably greater than or equal to 500 mV. Since the oxidizability of the ozone water is increased when the oxidization-reduction potential is greater than or equal to 1V, the oxidization reaction at surface 2a can be further facilitated.

Carbon dioxide gas can be mixed into ozone water at step S2. By mixing carbon dioxide gas, the pH of ozone water can be reduced to suppress ozone decomposition and effectively remove metal adhering to surface 2a. Preferably, the pH of ozone water is adjusted using carbon dioxide gas, mixed so as to facilitate oxidization reaction at surface 2a.

At step S2, ozone water is supplied to surface 2a of SiC substrate 2 using a cleaning apparatus for wafer cleaning, for example. The ozone water is supplied all over surface 2a of SiC substrate 2 for at least 30 seconds and not more than 3 minutes through a swinging nozzle of ozone water supply. When the duration of ozone water supply is greater than or equal to 30 seconds, an oxide film can be reliably formed at surface 2a of SiC substrate 2. When the duration is less than or equal to 3 minutes, the cleaning throughput of SiC substrate 2 can be increased. Depending upon the supply functionality at the cleaning apparatus system such as the outer diameter size of SiC substrate 1, the flow rate of ozone water supply, the number of nozzles, and the like in practice, the step can be carried out in approximately 3 minutes in practice.

At step S2, an oxide film of at least one molecular layer and having a thickness less than or equal to 30 nm is formed. By forming an oxide film having a thickness of at least one molecular layer, impurities, particles and the like present at surface 2a can be captured into the oxide film. By forming an oxide film less than or equal to 30 nm, the removal of the oxide film at subsequent step S3 is feasible.

Figure 3:
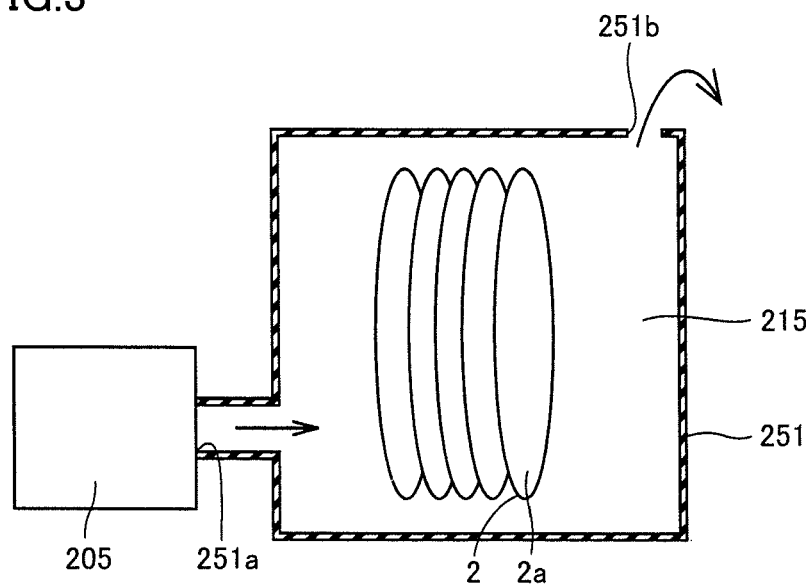
FIG. 3 is a schematic diagram of a SiC semiconductor cleaning apparatus according to the first embodiment of the present invention.

A SiC semiconductor cleaning apparatus that can be used to form an oxide film at step S2 will be described with reference to FIG. 3. FIG. 3 is a schematic diagram of an apparatus that can be used in forming an oxide film according to the first embodiment of the present invention.

The main configuration of the SiC semiconductor cleaning apparatus of FIG. 3 will be described. Referring to FIG. 3, the SiC semiconductor cleaning apparatus mainly includes an ozone water supply unit 205, and a reactor vessel 251 connected to ozone water supply unit 205. Ozone water supply unit 205 stores ozone water 215 set forth above inside, and supplies ozone water 215 to reactor vessel 251. Reactor vessel 251 stores ozone water 215 and SiC substrate 2 therein. Reactor vessel 251 includes an opening 251a through which ozone water 215 flows in from ozone water supply unit 205, and an opening 251b from which ozone water 215 is discharged outside.

The SiC semiconductor cleaning apparatus may include various elements other than those set forth above. For the sake of simplification, illustration and description of such elements will not be provided here.

Formation of an oxide film at surface 2a of SiC substrate 2 using the above-described SiC semiconductor cleaning apparatus is performed as set forth below. The above-described ozone water is supplied through opening 251a from ozone water supply unit 205 into reactor vessel 251, as indicated by the arrow in FIG. 3, at the flow rate of several L/m. Then, the ozone water is caused to overflow, as indicated by the arrow in FIG. 3, from opening 251b of reactor vessel 251. Accordingly, ozone water 215 can be stored in reactor vessel 251. Furthermore, SiC substrate 2 is placed in reactor vessel 251. The number of SiC substrates 2 to be arranged is, but not particularly limited to, two. Preferably, a plurality of substrates are placed from the standpoint of improving the throughput. Reaction between the ozone water and surface 2a of SiC substrate 2 immersed in ozone water is effected to form an oxide film at surface 2a of SiC substrate 2.

Then, surface 2a of SiC substrate 2 is cleaned with pure water (pure water rinsing step). The pure water is preferably ultra pure water. Cleaning can be performed by applying ultrasonic waves to the pure water. It is to be noted that this step is dispensable.

Then, surface 2a of SiC substrate 2 is dried (drying step). Drying is carried out by, but not particularly limited to, using a spin drier or the like, for example. It is to be noted that this step is dispensable.

Then, the oxide film is removed (step S3). Since the oxide film capturing impurities, particles and the like at step S2 is removed at step S3, the impurities, particles and the like present at surface 2a of SiC substrate 2 prepared at step S1 can be removed.

At step S3, removal is carried out using HF, preferably dilute HF (DHF) greater than or equal to 5% and less than or equal to 10%. In the case where removal is to be effected using HF, the HF is stored in the reactor vessel and SiC substrate 2 is immersed in the HF. Thus, the oxide film can be removed.

The method of removing the oxide film is not limited to the usage of HF, and another type of solution such as $NH_4F$ (ammonium fluoride) may be used. The oxide film may be removed in dry atmosphere. Dry atmosphere implies that the oxide film is removed by dry etching, in vapor phase such as plasma, or the like, and may include liquid phase not intended.

Step S2 of forming an oxide film and step S3 of removing the oxide film may be carried out simultaneously. This "simultaneously" implies that the steps are at least partially overlapping. In other words, at least one of the start and end may be at the same timing, or the starting and ending timing may differ in the two steps.

In the case where step S2 of forming an oxide film and step S3 of removing the oxide film are carried out simultaneously, the ozone water and HF, for example, are supplied at the same time. Accordingly, an oxide film can be formed at surface 2a of SiC substrate 2 while removing the oxide film.

Then, surface 2a of SiC substrate 2 is cleaned with pure water (pure water rinsing step). Then, surface 2a of SiC substrate 2 is dried (drying step). The pure water rinsing step and drying step are similar to those of the steps set forth above, and are dispensable.

By carrying out the steps set forth above (step S1-S3), the impurities, particles and the like adhering to surface 2a of SiC substrate 2 can be removed. Steps S2 and S3 may also be repeated. Furthermore, a cleaning step, a pure water cleaning step, a drying step and the like based on another chemical solution may be additionally carried out. For this another chemical solution, SPM including sulfuric acid and hydrogen peroxide solution, for example, can be cited. In the case of cleaning with SPM prior to step S2, organic matters can also be removed. Further, RCA cleaning or the like may be carried out prior to step S2.

Modification

Figure 4:
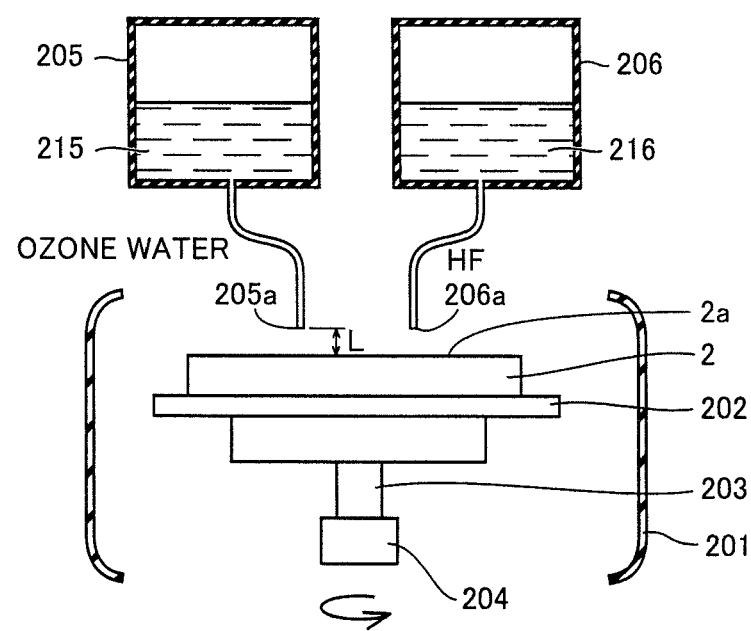
FIG. 4 is a schematic diagram of a SiC semiconductor cleaning apparatus according to a modification of the first embodiment.

FIG. 4 is a schematic diagram of an apparatus that can be used to form an oxide film according to a modification of the first embodiment of the present invention. A method of cleaning a SiC substrate according to the modification will be described with reference to FIG. 4. The method of cleaning a SiC substrate of the present modification differs in that the SiC semiconductor cleaning apparatus of FIG. 4 is used instead of the SiC semiconductor cleaning apparatus shown in FIG. 3.

The SiC semiconductor cleaning apparatus of FIG. 4 mainly includes a chamber 201, a substrate holder 202, a support 203, a driver 204, an ozone water supply unit 205, and an HF supply unit 206. The SiC semiconductor cleaning apparatus of FIG. 4 is directed to removing the oxide film formed at surface 2a of SiC substrate 2.

Substrate holder 202, support 203, and driver 204 are provided in chamber 201. Substrate holder 202 holds SiC substrate 2. The number of SiC substrates 2 held is, though not particularly limited to, 1, for example, from the standpoint of forming an oxide film having the in-plane uniformity improved. Support 203 is connected to substrate holder 202 to hold substrate holder 202. Driver 204 is connected to support 203 to rotate substrate holder 202 via support 203. Namely, by driver 204, SiC substrate 2 placed on substrate holder 202 can be rotated as indicated by the arrow in FIG. 4. Driver 204 is, for example, a motor.

Ozone water supply unit 205 stores ozone water 215 set forth above inside, and supplies the ozone water to surface 2a of SiC substrate 2 placed on substrate holder 202. Ozone water supply unit 205 includes a nozzle 205a to discharge ozone water 215. The distance L between the leading end of nozzle 205a and surface 2a of SiC substrate 2 is preferably less than or equal to 3 cm. In this case, ozone decomposition caused by the difference between the pressure when ozone water is discharged through the nozzle and the pressure when supplied to SiC substrate 2 can be reduced. Therefore, the decomposition of ozone prior to reaction with surface 2a of SiC substrate 2 can be suppressed, allowing the oxidation reaction to be performed effectively at the surface.

HF supply unit 206 stores therein HF 216 described above, and supplies HF to surface 2a of SiC substrate 2 placed on substrate holder 202. HF supply unit 206 includes a nozzle 206a to discharge HF 216.

Although the SiC semiconductor cleaning apparatus shown in FIG. 4 may include various elements other than those set forth above, the illustration and description of these elements will not be provided for the sake of simplicity. Further, the SiC semiconductor cleaning apparatus of FIG. 4 is not particularly limited to single wafer processing.

Cleaning of surface 2a of SiC substrate 2 using the SiC semiconductor cleaning apparatus of FIG. 4 is carried out as set forth below. SiC substrate 2 is placed on substrate holder 202 such that surface 2a of SiC substrate 2 prepared at step S1 faces ozone water supply unit 205 and HF supply unit 206. Then, ozone water 215 described above is supplied from nozzle 205a of ozone water supply unit 205 onto surface 2a of SiC substrate 2. Driver 204 causes SiC substrate 2 placed on substrate holder unit 202 to be rotated at 200 rpm. Ozone water may be supplied with the nozzle swinging left and right. Accordingly, ozone water can be supplied evenly to surface 2a of SiC substrate 2. As a result, reaction between the supplied ozone water and surface 2a of SiC substrate 2 proceeds. An oxide film can be formed at surface 2a of SiC substrate 2. When formation of an oxide film is completed, the supply of ozone water from ozone water supply unit 205 is stopped.

At step S3 of removing the oxide film, the HF described above is supplied from HF supply unit 206 to surface 2a of SiC substrate 2. Similarly, SiC substrate 2 is rotated by driver 204. Accordingly, HF can be supplied evenly to surface 2a of SiC substrate 2. As a result, reaction between the supplied HF and the oxide film formed at surface 2a of SiC substrate 2 proceeds. Therefore, the oxide film formed at surface 2a of SiC substrate 2 can be removed.

In the case where the apparatus of FIG. 4 includes a pure water supply unit (not shown), pure water may be supplied to surface 2a of SiC substrate 2, subsequent to step S2 or step S3. In this case, a pure water rinsing step can be carried out.

In the case where step S2 of forming an oxide film and step S3 of removing the oxide film are carried out simultaneously, the ozone water output from ozone water supply unit 205 and the HF output from HF supply unit 206 are supplied to SiC substrate 2 simultaneously. Accordingly, the reaction of forming an oxide film and the reaction of removing the formed oxide film can proceed simultaneously.

The advantage of the method of cleaning SiC substrate 2 as a SiC semiconductor of the present embodiment will be described hereinafter in comparison with conventional art.

When the conventional method of cleaning a Si substrate is applied to a SiC substrate, an oxide film will not be readily formed on the SiC substrate since a SiC substrate is less susceptible to oxidation than a Si substrate. For example, if the cleaning method of the aforementioned Patent Literatures 1 and 2 is applied to a SiC substrate, the ozone will be decomposed, hardly contributing to oxidation at the surface of the SiC substrate. Therefore, the cleaning effect on SiC substrate 2 is extremely low. Therefore, when a SiC substrate is cleaned using the conventional method of cleaning a Si substrate, the cleaning at the surface of the SiC substrate was insufficient. Thus, a method of cleaning a SiC substrate was not conventionally established.

The inventors drew their attention to the fact that a SiC substrate is chemically stable, and found out that a SiC substrate will not be readily damaged even if the oxidation method that causes damage in a Si substrate is employed. As a result of diligent study on the conditions for oxidizing the surface of a SiC substrate, the inventors arrived at the method of cleaning a SiC substrate according to the embodiment set forth above. In other words, the method of cleaning a SiC substrate 2 as a SiC semiconductor in the present embodiment includes a step S2 of forming an oxide film at surface 2a of SiC substrate 2 and a step S3 of removing the oxide film. At forming step S2, an oxide film is formed using ozone water having a concentration greater than or equal to 30 ppm. Simultaneously, the removal effect can be increased by causing the oxidizability that will produce damage at a Si substrate to act directly on the impurities and particles at the same time to improve the removal effect.

By using ozone water having a concentration greater than or equal to 30 ppm at step S2, an oxide film can be formed at surface 2a of SiC substrate 2 that is chemically and thermally stable. Accordingly, metal impurities such as titanium (Ti), particles and the like adhering to surface 2a are captured into or on the surface of the oxide film. Further, since ionization of metal is allowed in ozone water, impurities can be disengaged from surface 2a by causing ionization of the metal adhering to surface 2a. By removing the oxide film at step S3 under this state, the impurities and particles captured inside or on the surface of the oxide film as well as impurities disengaged from surface 2a of SiC substrate 2 can be removed. Furthermore, since the particles and surface 2a of SiC substrate are homopolarized, the particles will become less susceptible to adhering again to surface 2a of SiC substrate 2 by the repelling force against each other. Thus, by the method of cleaning a SiC substrate according to the present embodiment, the cleaning effect on SiC substrate 2 can be presented.

Second Embodiment

Figure 5:
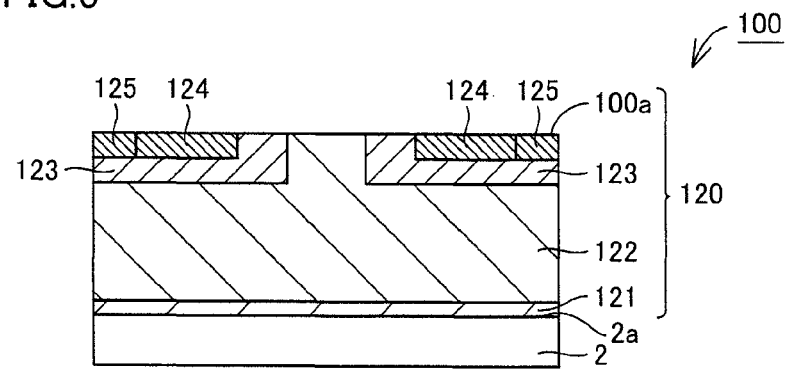
FIG. 5 is a schematic sectional view of a SiC semiconductor according to a second embodiment of the present invention.
Figure 6:
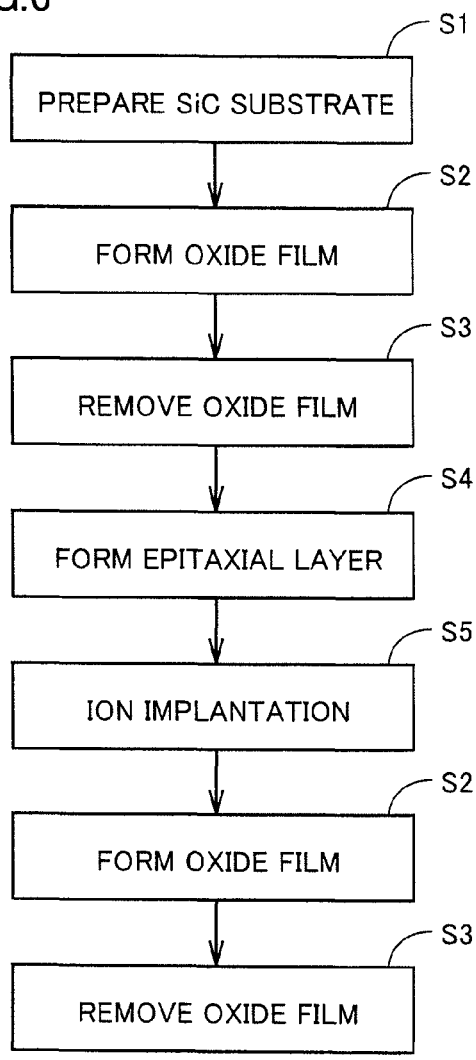
FIG. 6 is a flowchart of a method of cleaning a SiC semiconductor according to the second embodiment of the present invention.
Figure 7:
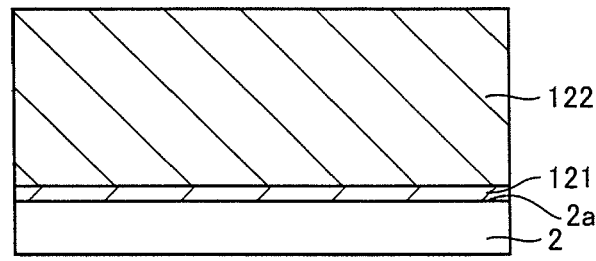
FIG. 7 is a schematic sectional view of a step in a method of cleaning a SiC semiconductor according to an embodiment of the present invention.

FIG. 5 is a schematic sectional view of a SiC semiconductor according to a second embodiment of the present invention. FIG. 6 is a flowchart of a method of cleaning a SiC semiconductor according to the second embodiment of the present invention. FIG. 7 is a schematic sectional view of one step in a method of cleaning a SiC semiconductor according to an embodiment of the present invention. A method of cleaning a SiC semiconductor according to the present embodiment will be described hereinafter with reference to FIGS. 2 and 5-7. As a SiC semiconductor in the present embodiment, a method of cleaning an epitaxial wafer 100 including a SiC substrate 2 and an epitaxial layer 120 formed on SiC substrate 2, as shown in FIG. 5, will be described.

As shown in FIGS. 2 and 5, SiC substrate 2 is prepared (step S1). Step S1 is similar to that of the first embodiment. Therefore description thereof will not be repeated.

As shown in FIGS. 2 and 5, an oxide film is formed at surface 2a of SiC substrate 2 (step S2). Then, the oxide film is removed (step S3). Since steps S2 and S3 are similar to those of the first embodiment, description thereof will not be repeated. Accordingly, surface 2a of SiC substrate 2 can be cleaned. It is to be noted that the cleaning of surface 2a of SiC substrate 2 (i.e steps S2 and S3) is dispensable.

As shown in FIGS. 5-7, epitaxial layer 120 is formed on surface 2a of SiC substrate 2 by vapor phase growth, liquid phase growth, or the like (step S4). Formation of epitaxial layer 120 is carried out as set forth below in the present embodiment.

As shown in FIG. 7, a buffer layer 121 is formed on surface 2a of SiC substrate 2. Buffer layer 121 is formed of SiC having n type conductivity, and is an epitaxial layer having a thickness of 0.5 μm, for example. The concentration of conductive impurities in buffer layer 121 is $5 \times 10^{17}$ cm$^{-3}$, for example.

Then, a breakdown voltage holding layer 122 is formed on buffer layer 121. For this breakdown voltage holding layer 122, a layer made of SiC having n type conductivity is formed by vapor phase growth, liquid phase growth, or the like. The thickness of breakdown voltage holding layer 122 is 15 μm, for example. The concentration of n type conductive impurities of breakdown voltage holding layer 122 is $5 \times 10^{15}$ cm$^{-3}$, for example.

Then, ions are implanted into the epitaxial layer, as shown in FIGS. 5 and 6 (step S5). In the present embodiment, a p type well region 123, an n$^+$ source region 124, and a p type contact region 125 shown in FIG. 5 are formed as set forth below. First, p type impurities are selectively implanted into a portion of breakdown voltage holding layer 122 to form a well region 123. Then, by selectively introducing n type conductive impurities into a predetermined region, source region 124 is formed. Furthermore, by selectively introducing p type conductive impurities into a predetermined region, contact region 125 is formed. The selective introduction of impurities is carried out using a mask formed of an oxide film, for example.

Following the implantation step, an activation annealing process may be carried out. For example, annealing is carried out for 30 minutes in an argon atmosphere at the heating temperature of 1700° C.

By these steps, epitaxial wafer 100 including SiC substrate 2 and epitaxial layer 120 formed on SiC substrate 2 can be prepared.

Then, a surface 100a of epitaxial wafer 100 is cleaned. Specifically, an oxide film is formed at surface 100a of epitaxial wafer 100 using ozone water having a concentration greater than or equal to 30 ppm (step S2). This step S2 is similar to step S2 forming an oxide film on surface 2a of SiC substrate 2 in the first embodiment. Therefore, description thereof will not be repeated.

Then, the oxide film formed on surface 100a of epitaxial wafer 100 is removed (step S3). Since this step S3 is similar to step S3 in the first embodiment removing an oxide film formed on surface 2a of SiC substrate 2, description thereof will not be repeated.

By carrying out the steps set forth above (S1-S5), the impurities, particles, and the like adhering to surface 100a of epitaxial wafer 100 shown in FIG. 5 can be cleaned away.

According to the method of cleaning epitaxial wafer 100 of the present embodiment, an oxide film capturing impurities, particles and the like can be formed at surface 100a even for a SiC semiconductor including an epitaxial wafer 100 less susceptible to oxidation, by using ozone water having a concentration greater than or equal to 30 ppm. Then, by removing the oxide film, the impurities, particles and the like adhering to surface 100a can be removed. Thus, surface 100a of epitaxial wafer 100 can be cleaned.

The impurities, particles and the like present at surface 100a of epitaxial wafer 100 can be reduced as set forth above. Therefore, in the case where an insulation film constituting a semiconductor device such as a gate oxide film is formed on surface 100a to produce a semiconductor device, the property of the insulation film can be improved. In addition, the impurities, particles and the like present at the interface between surface 100a and the insulation film, and present in the insulation film, can be reduced. Therefore, the breakdown voltage of the semiconductor device such as when reverse voltage is applied can be improved. Also, stability in the operation when forward voltage is applied as well as long-term reliability can be improved. Thus, the method of cleaning a SiC semiconductor of the present embodiment is particularly applicable to surface 100a of epitaxial wafer 100 prior to forming a gate oxide film.

Epitaxial wafer 100 cleaned according to the present embodiment allows the property of the insulation film to be improved by forming such an insulation film on a cleaned surface 100a. Therefore, epitaxial wafer 100 is applicable to a semiconductor device including an insulation film. Thus, epitaxial wafer 100 cleaned according to the present embodiment is applicable to a semiconductor device having an insulation gate type field effect portion such as an MOSFET (Metal Oxide Semiconductor Field Effect Transistor) or IGBT (Insulated Gate Bipolar Transistor), or JFET (Junction Field-Effect Transistor).

The first embodiment is directed to a method of cleaning surface 2a of SiC substrate 2. The second embodiment is based on a SiC substrate 2 and a SiC epitaxial layer 120 formed on SiC substrate 2, and is directed to a method of cleaning surface 100a of epitaxial wafer 100 having ion-implanted surface 100a. The cleaning method of the present invention is also applicable to a SiC epitaxial layer having a surface that is not ion-implanted. Furthermore, in the case where epitaxial wafer 100 is to be cleaned, at least one of a surface 2a of SiC substrate 2 constituting epitaxial wafer 100 and surface 100a of epitaxial wafer 100 may be cleaned. In other words, the method of cleaning a SiC semiconductor of the present invention includes the case where: (i) a SiC substrate is cleaned; and (ii) an epitaxial wafer including a SiC substrate and an epitaxial layer formed on the SiC substrate is cleaned. The SiC epitaxial layer of (ii) includes a surface subjected to ion implantation, and a surface not subjected to ion implantation.

EXAMPLES

The effect of forming an oxide film on the surface of a SiC semiconductor using ozone water having a concentration greater than or equal to 30 ppm was examined.

Example 1 of Present Invention

Figure 8:
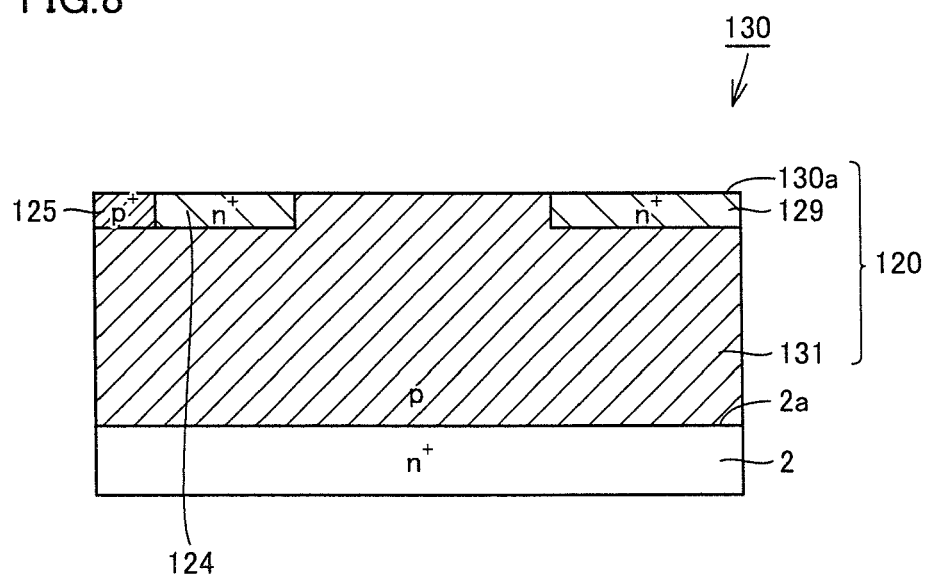
FIG. 8 is a schematic sectional view of an epitaxial wafer for cleaning in Examples 1 and 2 and Comparative Example 1.

As a SiC semiconductor of Example 1, an epitaxial wafer 130 shown in FIG. 8 was cleaned. FIG. 8 is a schematic sectional view of epitaxial wafer 130 cleaned according to Examples 1 and 2 and Comparative Example 1.

Specifically, a 4H—SiC substrate having a surface was prepared as SiC substrate 2 (step S1).

Then, a p type SiC layer 131 having a thickness of 10 μm and an impurity concentration of $1\times10^{16}$ cm$^{-3}$ was produced by CVD, as a layer constituting epitaxial layer 120 (step S4).

Using SiO$_2$ as a mask, a source region 124 and a drain region 129 having the impurity concentration of $1\times10^{19}$ cm$^{-3}$ with phosphorus (P) as the n type impurity was formed. Also, a contact region 125 having the impurity concentration of $1\times10^{19}$ cm$^{-3}$ with aluminum (Al) as the p type impurity was formed (step S5). The mask was removed after each ion implantation.

Then, activation annealing was carried out. This activation annealing was based on the condition of heating for 30 minutes at the heating temperature of 1700-1800° C. using Ar gas as the atmosphere gas.

Accordingly, epitaxial wafer 130 having surface 130a was prepared.

Then, ultra pure water including ozone at the concentration of 30 ppm was heated to 25° C. Using the single wafer processing type SiC semiconductor cleaning apparatus of FIG. 4, the ultra pure water was supplied at the flow rate of 1 slm to surface 130a of epitaxial wafer 130. At this stage, the rotation speed of epitaxial wafer 100 was 200 rpm. It was confirmed that an oxide film could be formed at surface 130a of epitaxial wafer 130 (step S2).

Then, surface 130a of epitaxial wafer 130 was cleaned with ultra pure water for one minute (pure water rinsing step).

Then, dilute HF at the concentration greater than or equal to 5% and less than or equal to 10% was supplied to surface 130a of epitaxial wafer 130. It was confirmed that the oxide film formed at step S2 could be removed (step S3).

Then, surface 130a of epitaxial wafer 130 was cleaned with ultra pure water for one minute (pure water rinsing step).

By the above-described steps (steps S1-S5), surface 130a of epitaxial wafer 130 was cleaned. Surface 130a subsequent to cleaning had impurities and particles reduced.

Example 2 of Present Invention

Example 2 was basically similar to Example 1, differing in that ozone water of 80 ppm was heated to 50° C. to be supplied to surface 130a of epitaxial wafer 130 at step S2. It was confirmed that an oxide film was formed at surface 130a even in such a case. Furthermore, it was confirmed that the oxide film formed at surface 130a was removed at step S3.

Comparative Example 1

Comparative Example 1 was basically similar to Example 1 of the present invention, differing in that ozone water of 20 ppm was supplied to surface 130a of epitaxial wafer 130 at step S2. It was confirmed that an oxide film was not formed at surface 130a in such a case. Therefore, impurities and particles were hardly reduced from surface 130a subsequent to cleaning in Comparative Example 1.

Thus, it is appreciated that an oxide film can be formed at the surface of a SiC semiconductor by using ozone water greater than or equal to 30 ppm according to the present embodiment It is also appreciated that by forming an oxide film on the surface of a SiC semiconductor and removing this oxide film, the impurities, particles and the like adhering to the surface can be reduced.

Although embodiments and examples of the present invention have been described in the foregoing, it is initially intended that the features of each embodiment and example are combined appropriately. It is to be understood that the embodiments and examples disclosed herein are only by way of example, and not to be taken by way of limitation. The scope of the present invention is not limited by the above-described embodiments and examples, but rather by the terms of the appended claims, and is intended to include any modifications within the scope and meaning equivalent to the terms of the claims.

REFERENCE SIGNS LIST

2 SiC substrate; 2a surface; 100, 130 epitaxial wafer; 100a, 130a surface; 120 epitaxial layer; 121 buffer layer; 122 breakdown voltage holding layer; 123 well region; 124 source region; 125 contact region; 129 drain region; 131 p type SiC layer; 201 chamber; 202 substrate holder; 203 support; 204 driver; 205 ozone water supply unit; 205a, 206a nozzle; 206 HF supply unit; 215 ozone water; 251 reactor vessel; 251a, 251b opening.

The invention claimed is:

1. A method of cleaning a silicon carbide semiconductor, comprising the steps of:
    forming an oxide film at a surface of a silicon carbide semiconductor, said oxide film being a silicon oxide film, and
    removing said oxide film,
    at said forming step, said oxide film being formed using ozone water having a concentration greater than or equal to 30 ppm.

2. The method of cleaning a silicon carbide semiconductor according to claim 1, wherein said forming step includes the step of heating at least one of said surface of said silicon carbide semiconductor and said ozone water.

3. The method of cleaning a silicon carbide semiconductor according to claim 2, wherein said heating step includes the step of heating said ozone water greater than or equal to 25° C. and less than or equal to 90° C.

4. The method of cleaning a silicon carbide semiconductor according to claim 2, wherein said heating step includes the step of heating said surface of said silicon carbide semiconductor greater than or equal to 25° C. and less than or equal to 90° C.

5. The method of cleaning a silicon carbide semiconductor according to claim 1, wherein, at said removing step, said oxide film is removed using hydrogen fluoride.

6. The method of cleaning a silicon carbide semiconductor according to claim 1, wherein said forming step and said removing step are carried out simultaneously.

7. The method of cleaning a silicon carbide semiconductor according to claim 1, wherein said forming step includes the step of mixing carbon dioxide gas into said ozone water.

* * * * *